(12) United States Patent
Hsu

(10) Patent No.: US 6,836,403 B2  
(45) Date of Patent: Dec. 28, 2004

(54) PDA AND BUTTON APPARATUS OF PDA

(75) Inventor: Chun-Yu Hsu, Taipei (TW)

(73) Assignee: Lite-On Technology Corporation, Taipei (TW)

(*) Notice: Subject to any disclaimer, the term of this patent is extended or adjusted under 35 U.S.C. 154(b) by 91 days.

(21) Appl. No.: 10/294,620

(22) Filed: Nov. 15, 2002

(65) Prior Publication Data

US 2004/0012915 A1 Jan. 22, 2004

(30) Foreign Application Priority Data

Jul. 17, 2002 (TW) .................................. 91210894 U

(51) Int. Cl.[7] .................................................. G06F 1/16
(52) U.S. Cl. ....................... 361/679; 200/1 R; 200/18; 341/34; 345/160
(58) Field of Search ............................ 361/679, 868; 200/1 R–6 R, 18, 512–517; 341/20–24, 34; 345/160, 161

(56) References Cited

U.S. PATENT DOCUMENTS

| | | | | |
|---|---|---|---|---|
| 5,621,196 A | * | 4/1997 | Nishijima et al. | .......... 200/6 A |
| 6,441,753 B1 | * | 8/2002 | Montgomery | ............... 200/6 A |
| 6,717,074 B2 | * | 4/2004 | Lu | .............................. 200/5 R |
| 2002/0023828 A1 | * | 2/2002 | Chan et al. | ................. 200/6 A |
| 2004/0000466 A1 | * | 1/2004 | Kubat et al. | ................ 200/6 A |

* cited by examiner

*Primary Examiner*—Lisa Lea-Edmonds  
(74) *Attorney, Agent, or Firm*—Donald R. Studebaker; Nixon Peabody, LLP

(57) ABSTRACT

The present invention provides a button apparatus for an electrical device having a circuit board with M switch devices wherein M is a positive integer number. The button apparatus includes a body and a pillar. The body has M protrusions respectively corresponding to the M switch devices for selectively actuating the M switch devices. The pillar has a first end and a second end. The second end has a projection used as a pivot. The first end presses against a central part of the body. When the body is pushed downward, the body presses upon the first end and the projection touches against the circuit board for controlling one of the M protrusions to selectively actuate one corresponding switch device.

12 Claims, 8 Drawing Sheets

PDA AND BUTTON APPARATUS OF PDA

This Application claims priority to Taiwan Patent Application Serial No. 091210894 filed on Jul. 17, 2002.

FIELD OF INVENTION

The present invention relates to a button apparatus, and more specifically, to a button apparatus for a personal digital assistant (PDA).

BACKGROUND OF THE INVENTION

As electronic technology progresses, the size of the many electrical devices can be made smaller and smaller. Consumers also love the electrical devices of small size without sacrificing the original functions because they are easy to carry and dispose. To catch up with the general trend, approach of size reduction of the button apparatus for an electrical device is rapidly followed by designers. Accordingly, there are many kinds of button apparatuses of small size coming to the market now.

Taking a PDA as an example, a PDA does not provide a conventional keyboard or a mouse in it for the mobile convenience. Instead, a stylus and few buttons are provided to control the cursor movement on the screen. A user is able to manipulate information or store data by using the stylus and the buttons. In general, most PDAs utilize a single direction button to control upward, downward, leftward, or rightward movement of a cursor.

Since a PDA is forced to reduce the size for commercial and practical consideration, the size of the direction button on a PDA is inevitably forced to reduce as well. However, size over-reduction of the direction button results in drawbacks, e.g. uncomfortable feeling of use, imprecise data input, slow input operation, and especially accidental erroneous actuation. Accidental erroneous actuation not only decreases the efficiency of cursor movement, but also wastes power. Therefore, the PDA of a small direction button is not very popular to consumers due to those drawbacks.

Moreover, the functions of a PDA greatly enhance nowadays by advanced technology. The function enhancement makes the number of the buttons on a PDA growing and also requires each button be capable of executing more functions. For example, the Enter function has been implanted into the traditional direction button in which drives the cursor upward, downward, leftward, or rightward. The probability of accidental erroneous actuation will increase for the type of PDA having small button of many functions. Therefore, the idea of implementing many functions within single button places restriction on size reduction trend of buttons.

Accidental erroneous actuation might occur when a user puts a PDA in a pocket or in a briefcase. Once the PDA is turned on due to accidental erroneous actuation, it consumes power of the battery and, furthermore, might damage data stored in the PDA at the worst case.

To satisfy consumers' requirements, the kind of PDA, which provides a small button apparatus capable of avoiding accidental erroneous actuation is desired.

SUMMARY OF THE INVENTION

The present invention provides a button apparatus for an electrical device which has a circuit board. The circuit board includes M switch devices wherein M is a positive integer number.

The button apparatus of the present invention includes a body and a pillar. The body has M protrusions respectively corresponding to the M switch devices for selectively actuating the M switch devices. The pillar includes a first end and a second end. The second end has a projection used as a pivot. The first end presses against a central part of the body.

When the body is pushed downward, the body presses upon the first end and the projection touches against the circuit board in order to control one of the M protrusions to selectively actuate the very corresponding switch device.

The further aspects and advantages of the present invention will be clearly disclosed by the following detailed description and the attached figures.

DETAILED DESCRIPTION

The aspect of the present invention is to disclose a small button apparatus for resolving the problem of accidental erroneous actuation. The button apparatus of the present invention not only reduces size of button and maintains the preciseness of button operation in the meanwhile, but also avoids depressing the button by accident.

Figure 1A:
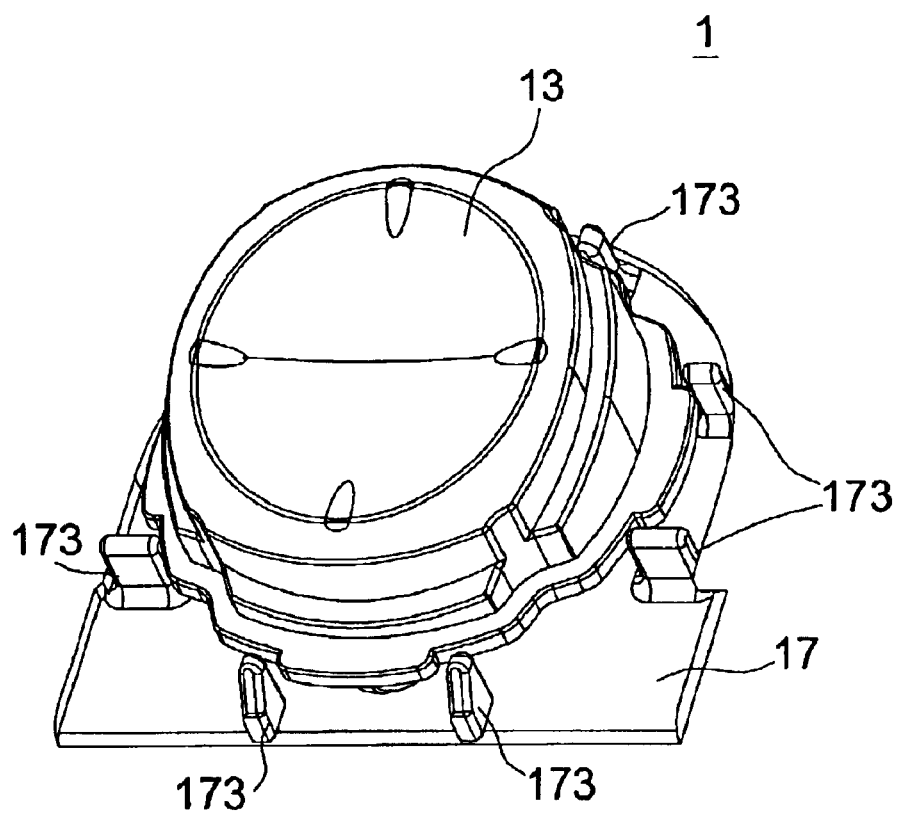
FIG. 1(A), FIG. 1(B), FIG. 1(C), and FIG. 1(D) illustrate an exemplary button apparatus of the present invention.

FIG. 1(A), FIG. 1(B), FIG. 1(C), and FIG. 1(D) illustrate an embodiment of the button apparatus of the present invention. As FIG. 1(A) shows, the present invention provides a button apparatus 1 for an electrical device which has a circuit board (not shown) with M switch devices respectively corresponding to M functions of the electrical device.

Figure 1B:
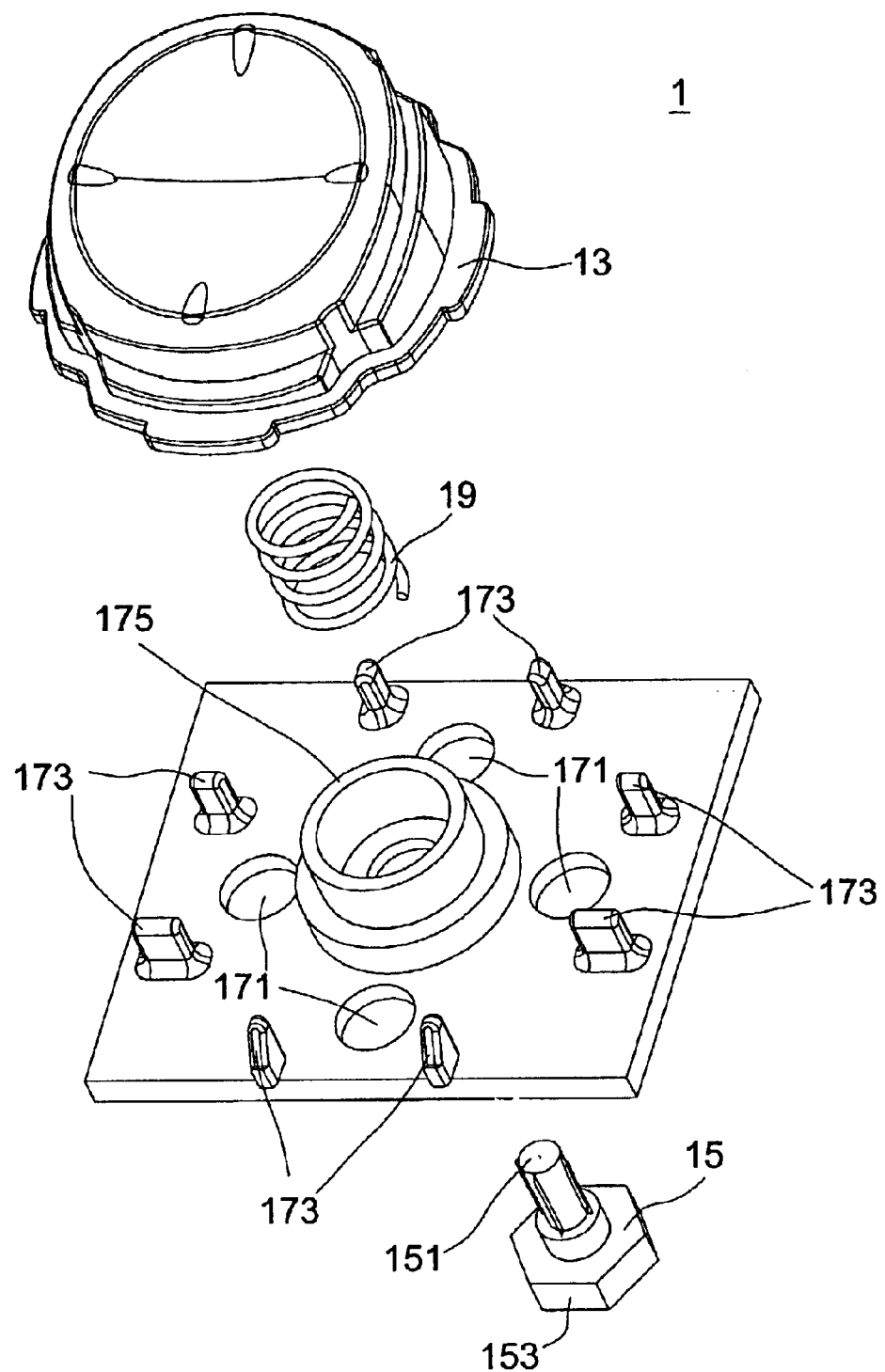
Figure 1C:
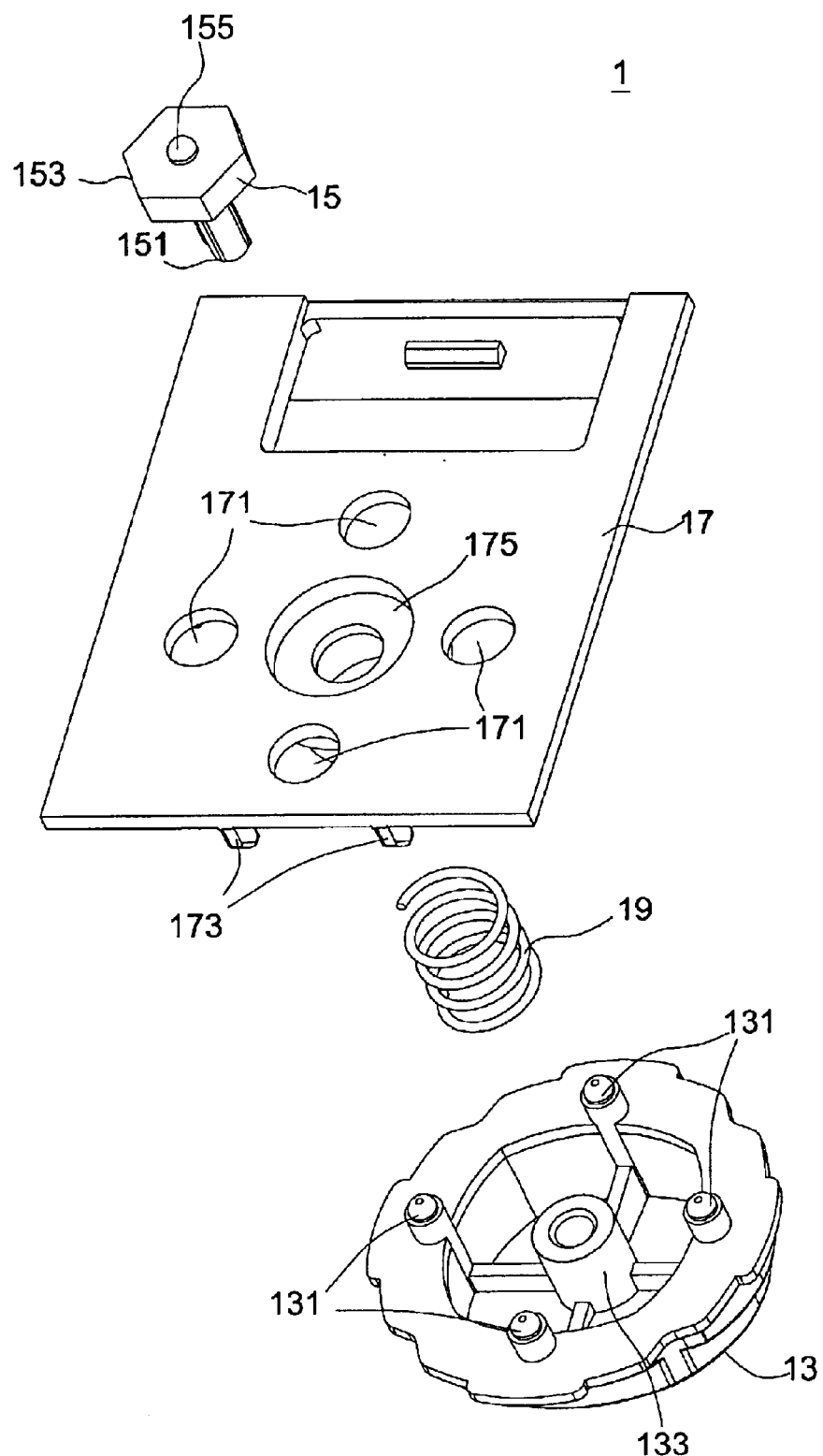
Figure 1D:
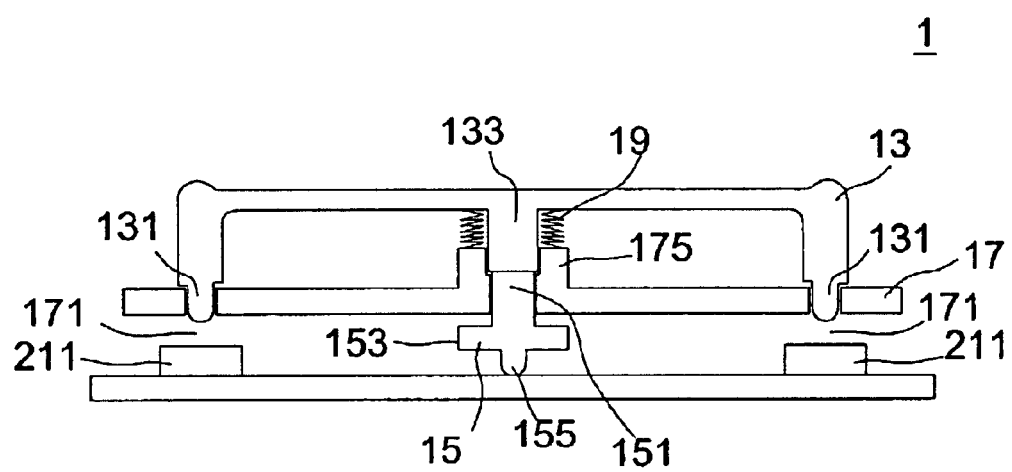

As FIG. 1(B), FIG. 1(C), and FIG. 1(D) show, the button apparatus includes a body 13 and a pillar 15. The body 13 has a central part and M protrusions 131 respectively corresponding to the M switch devices 211 for selectively actuating the M switch devices 211. The pillar 15 includes a first end 151 and a second end 153. The first end 151 presses against the central part of the body 13. The second end 153 has a projection 155 used as a pivot.

When a user pushes the body 13 downward, the body 13 presses upon the first end 151 against the central part of the body 13, and then the projection 155 touches against the circuit board. Therefore, one of the M protrusions 131 can actuate one of the M functions of the electrical device by selectively actuating the corresponding switch device 211.

By making use of leverage mechanism, the button apparatus 1 of the present invention takes the projection 155 of the pillar 15 as the pivot in the central part of the body 13 to control the movement of the button apparatus 1 and, accordingly, to selectively actuate the corresponding switch device 211. When the user depresses the button apparatus 1 accidentally, the projection 155 simply presses against the central part of the body 13, and no inappropriate activation occurs. The design herein has a merit of avoiding actuating the switch devices 211 accidentally when accidental erroneous actuation of the button apparatus 1 occurs. Consequently, the electrical device with the button apparatus 1 of the present invention can save power consumption.

The body 13 further includes a first hollow column 133 positioned in the central part of the body 13 for receiving the first end 151.

The button apparatus 1 of the present invention further includes an alignment board 17. The alignment board 17 includes M holes 171, a plurality of ribs 173, and a second hollow column 175. The M holes 171 respectively allow passage of the M protrusions 131. The ribs 173 are applied to adjust downward direction of the body 13. The second hollow column 175 engages with the first hollow column 133. The first end 151 passes through a channel of the second hollow column 175 and is inserted into a channel of the first hollow column 133.

Based on the above description, the ribs 173 are provided herein to limit the moving directions when the body 13 is pushed downward such that the user may prevent the button apparatus 1 from accidental erroneous actuation. Consequently, size reduction of the button apparatus 1 of the present invention does not increase the probability of accidental actuation.

Besides, the button apparatus 1 further includes a spring 19 positioned between the body 13 and the alignment board 17 for bouncing back the body 13 moving downward.

The pillar 15 of the current embodiment is a screw, but is not limited to a screw.

The exemplary button apparatus 1 of the present invention may be used as a direction button apparatus for controlling directions of any object. For example, if the value of M is 4, four switch devices 211 are provided in the circuit board to respectively control the moving directions of upward, downward, leftward, or rightward.

Figure 2A:
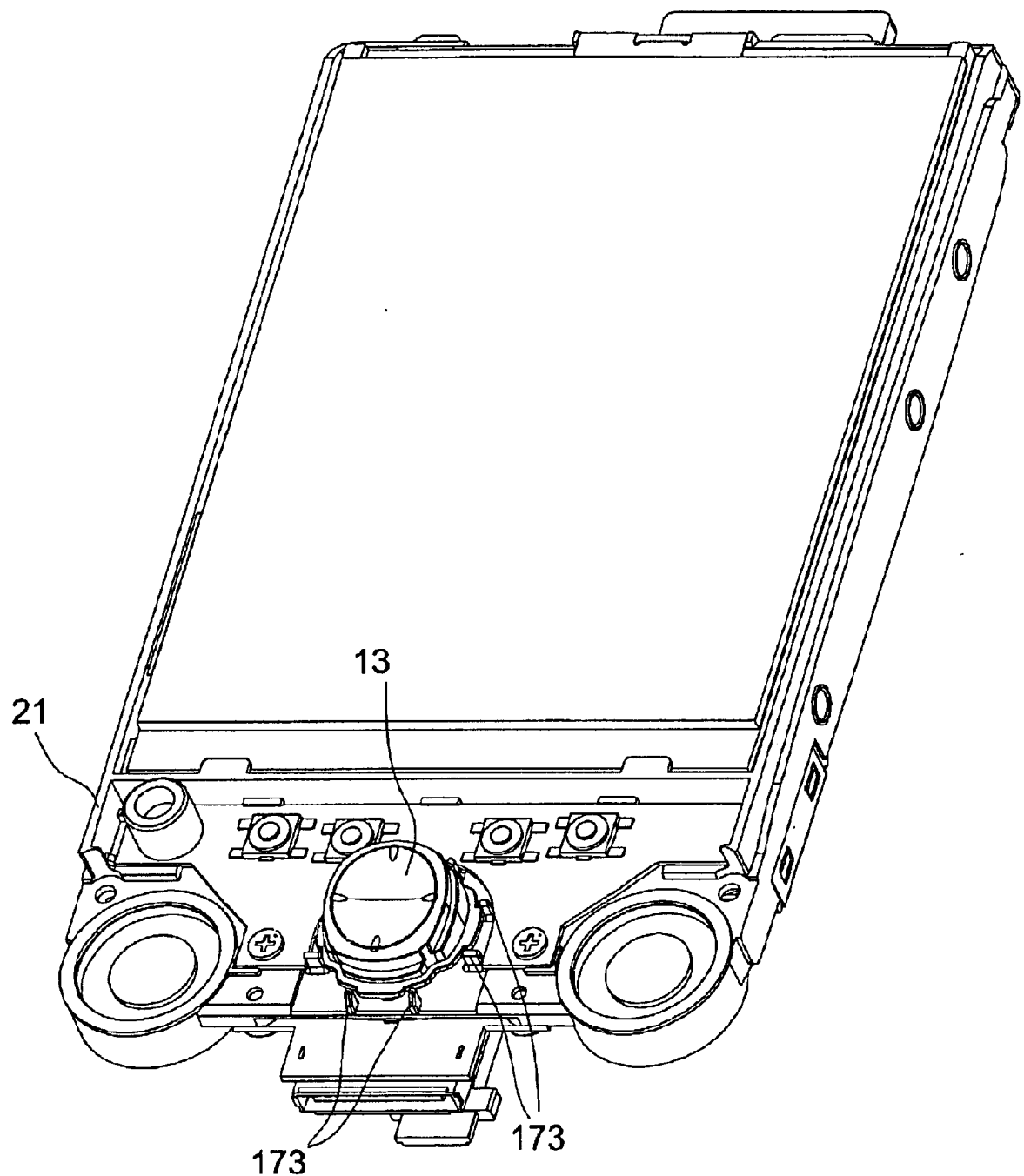
FIG. 2(A), FIG. 2(B), FIG. 2(C), and FIG. 2(D) illustrate an exemplary PDA with the button apparatus of the present invention.

FIG. 2(A), FIG. 2(B), FIG. 2(C), and FIG. 2(D) illustrate an exemplary PDA with the button apparatus 1 of the present invention. As FIG. 2(A) shows, the exemplary PDA 2 includes a circuit board 21 and the button apparatus 1 of the present invention.

Figure 2B:
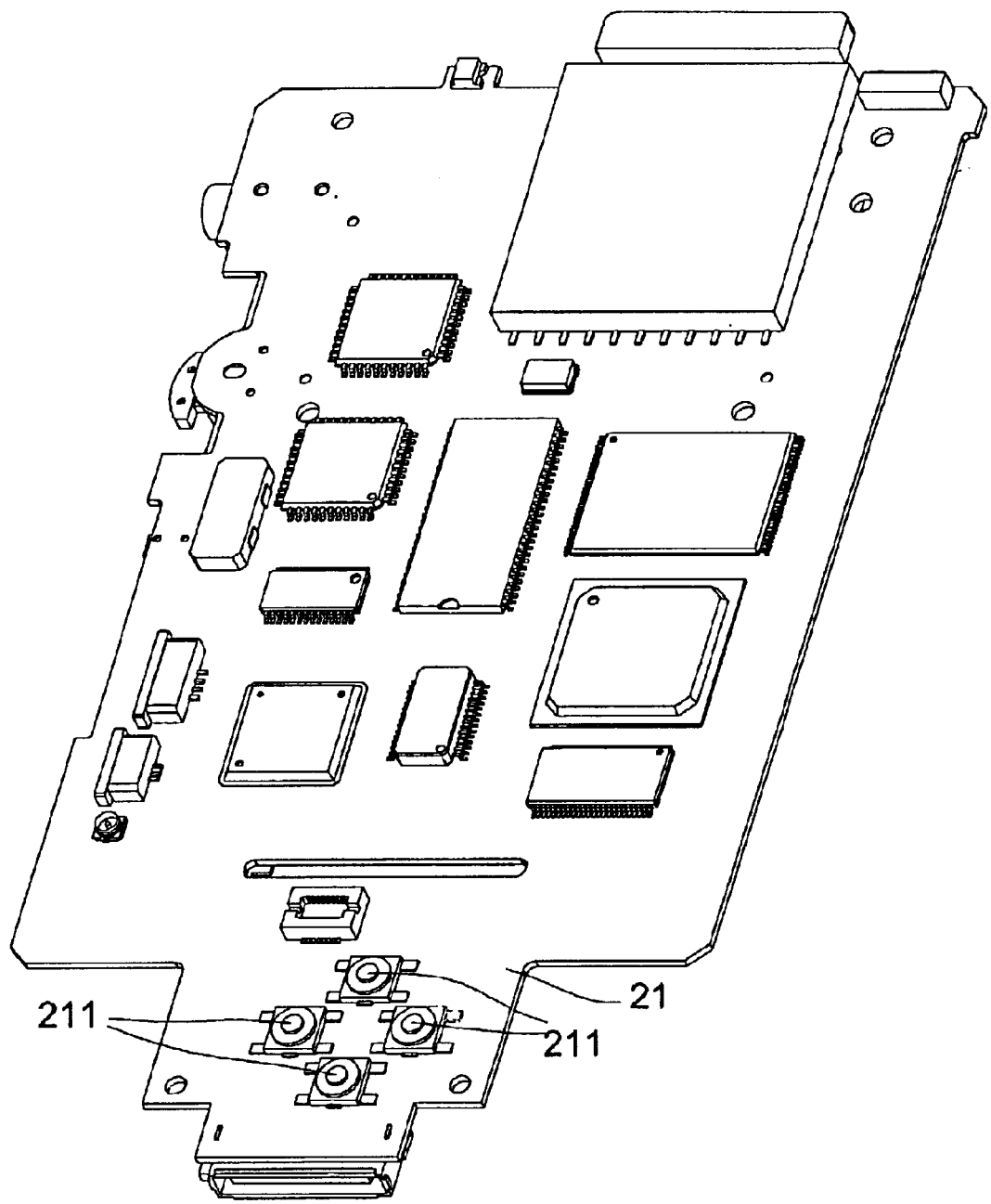

As FIG. 2(B) shows, the circuit board 21 has four switch devices 211 respectively corresponding to the four functions of the PDA 2. If the button apparatus 1 is used as a direction button apparatus, the four switch devices 211 respectively correspond to the upward, downward, leftward, and rightward directions.

Figure 2C:
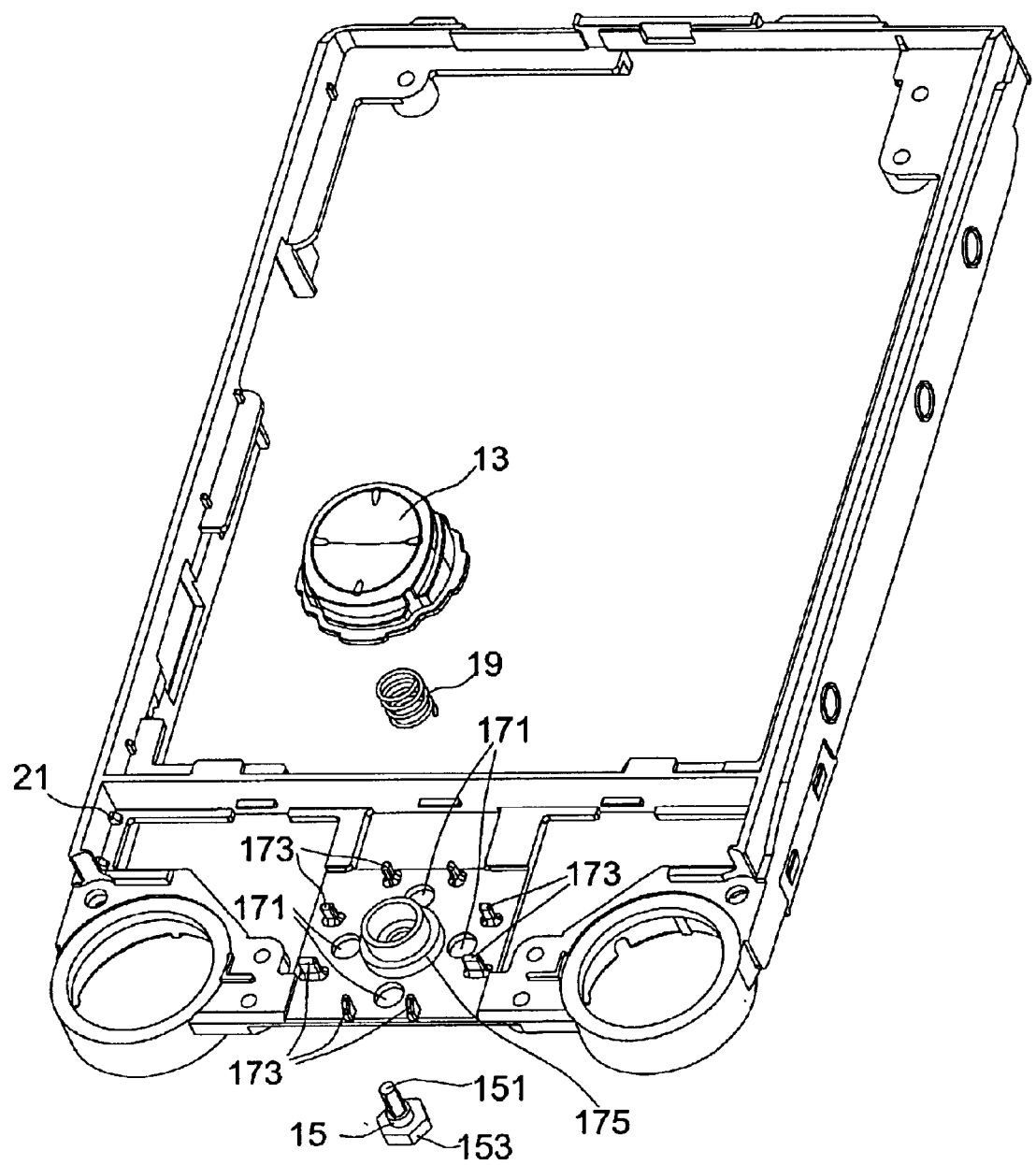
Figure 2D:
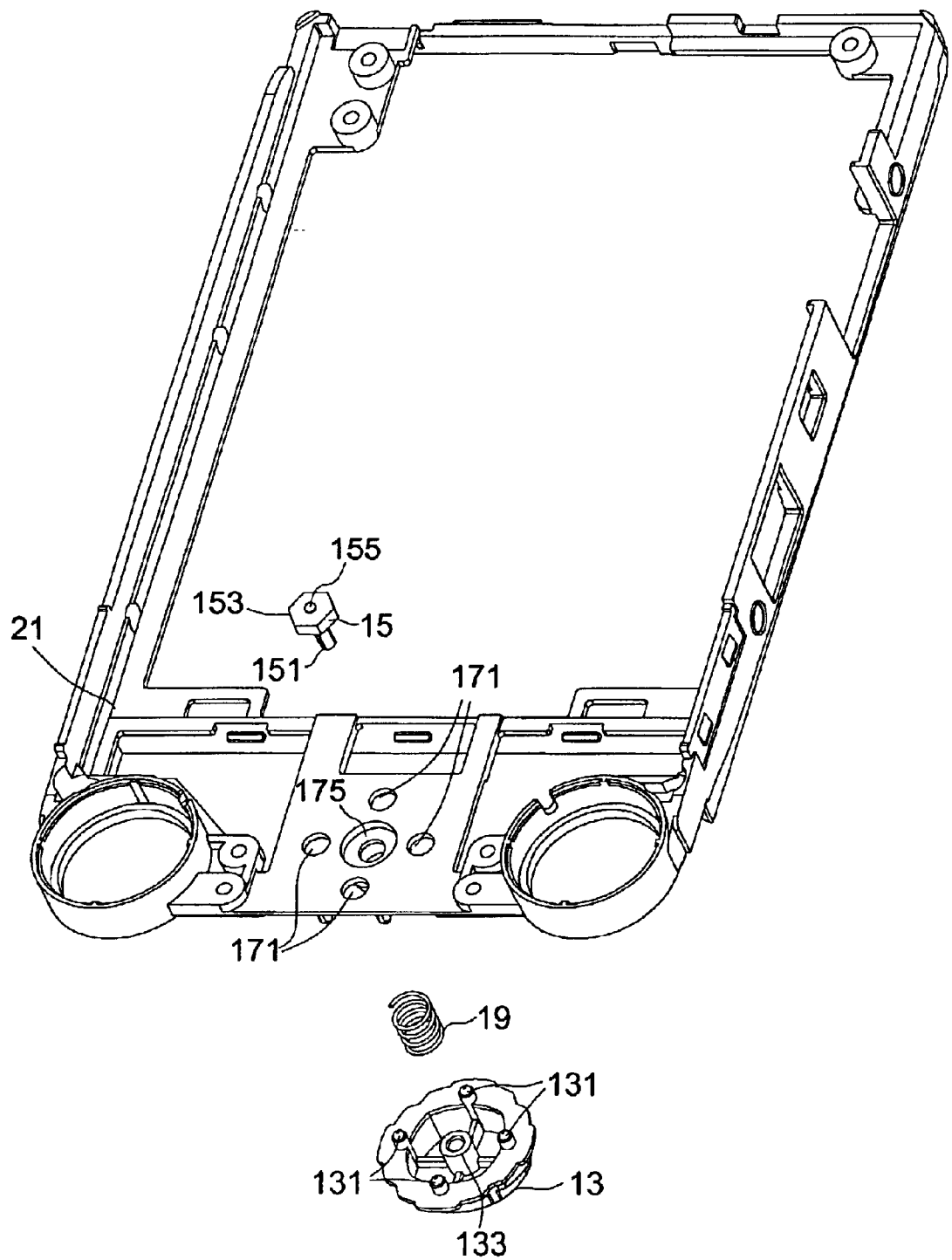

Referring to FIG. 2(C) and FIG. 2(D), the button apparatus 1 of the present invention includes a body 13, a pillar 15, an alignment board 17, and a spring 19. The body 13 has four protrusions 131, respectively corresponding to the four switch devices 211 of the circuit board 21, for selectively actuating the four switch devices 211. The pillar 15 includes a first end 151 and a second end 153. The first end 151 presses against a central part of the body 13 and is received in a first hollow column 133 of the body 13. The second end 153 has a projection 155 used as a pivot.

As FIG. 2(C) and FIG. 2(D) show, the alignment board 17 includes four holes 171, eight ribs 173, and a second hollow column 175. The four holes 171 respectively allow passage of the four protrusions 131. The eight ribs 173 are implemented for adjusting moving directions when the body 13 is pushed downward. The second hollow column 175 engages with the first hollow column 133. The first end 151 passes through a channel of the second column 175 and is inserted into a channel of the first hollow column 133.

The spring 19 is positioned between the body 13 and the alignment board 17 for bouncing back the body 13 moving downward.

When the user pushes the body 13 downward, the body 13 presses upon the first end 151 against the central part of the body 13, and then the projection 155 touches against the circuit board 21. Therefore, one of the protrusions 131 can actuate the corresponding function implemented in the PDA 2 by selectively actuating the corresponding switch device 211.

In the exemplary PDA 2, the pillar 15 is a screw. The button apparatus 1 of the present invention may be used as a direction button apparatus of the PDA 2 for controlling moving directions of the cursor on the screen. The four switch devices 211 respectively control four directions, i.e. upward, downward, leftward, and rightward.

By making use of leverage mechanism, the button apparatus 1 of the present invention takes the projection 155 of the pillar 15 as the pivot in the central part of the body 13 to control moving direction of the button apparatus 1 and, accordingly, to selectively actuate the corresponding switch device 211. Furthermore, the ribs 173 are provided herein to limit moving directions when the body 13 is pushed downward such that the user may prevent the button apparatus 1 from accidental erroneous actuation. When the user depresses the button apparatus 1 accidentally, the projection 155 simply presses against the central part of the body 13, and no inappropriate activation occurs. The design herein has a merit of avoiding actuating the switch devices 211 accidentally by accidental erroneous actuation of the button apparatus 1. Hence, the PDA 2 with the button apparatus 1 of the present invention can save power consumption.

Utilizing the present invention, engineers are able to reduce the size of the button apparatus 1 and, therefore, to reduce the size of the PDA 2 without the problem of accidental actuation.

The above description of the preferred embodiments is expected to clearly expound the characteristics of the present invention but not expected to restrict the scope of the present invention. Those skilled in the art will readily observe that numerous modifications and alterations of the apparatus may be made while retaining the teaching of the invention. Accordingly, the above disclosure should be construed as limited only by the bounds of the claims.

What is claimed is:

1. A button apparatus for an electrical device having a circuit board with M switch devices wherein M is a positive integer number, comprising:

a body having M protrusions respectively corresponding to the M switch devices for selectively actuating the M switch devices, the body including a central part;

a pillar comprising a first end and a second end, the second end having a projection used as a pivot, the first end pressing against the central part of the body; and an alignment board comprising:

M holes respectively allowing respective passage of the M protrusions; and a plurality of ribs for adjusting moving directions of the body when the body is pushed downward, wherein, when the body is pushed downward, the body presses upon the first end and the projection touches against the circuit board for controlling one of the M protrusions to selectively actuate one corresponding switch device.

2. The button apparatus of claim 1, wherein the body further comprises:

a first hollow column for receiving the first end.

3. The button apparatus of claim 1, wherein the alignment board further comprises:

a second hollow column engaging with the first hollow column, and the first end passing through a channel of the second hollow column and being inserted into a channel of the first hollow column.

4. The button apparatus of claim 1, wherein the button apparatus further comprises:

a spring, positioned between the body and the alignment board, for bouncing back the body moving downward.

5. The button apparatus of claim 1, wherein the pillar is a screw.

6. The button apparatus of claim 1, wherein the value of the M is 4.

7. A personal digital assistant comprising:

a circuit board having M switch devices wherein M is a positive integer number; and a button apparatus comprising:

a body having M protrusions respectively corresponding to the M switch devices for selectively actuating the M switch devices, the body including a central part;

a pillar comprising a first end and a second end, the second end having a projection used as a pivot, the first end pressing against the central part of the body; and an alignment board comprising:

M holes respectively allowing respective passage of the M protrusions; and a plurality of ribs for adjusting moving directions of the body when the body is pushed downward;

wherein, when the body is pushed downward, the body presses upon the first end and the projection touches against the circuit board for controlling one of the M protrusions to selectively actuate one corresponding switch device.

8. The personal digital assistant of claim 7, wherein the body further comprises:

a first hollow column for receiving the first end.

9. The personal digital assistant of claim 7, wherein the alignment board further comprises:

a second hollow column engaging with the first hollow column, and the first end passing through a channel of the second hollow column and being inserted into a channel of the first hollow column.

10. The personal digital assistant of claim 7, wherein the button apparatus further comprises:

a spring, positioned between the body and the alignment board, for bouncing back the body moving downward.

11. The personal digital assistant of claim 7, wherein the pillar is a screw.

12. The personal digital assistant of claim 7, wherein the value of the M is 4.

* * * * *